(12) United States Patent
Murata

(10) Patent No.: US 7,679,386 B2
(45) Date of Patent: Mar. 16, 2010

(54) PROBE CARD INCLUDING CONTACTORS FORMED PROJECTION PORTION

(75) Inventor: Shinji Murata, Fukushima-Ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/102,313

(22) Filed: Apr. 14, 2008

(65) Prior Publication Data

US 2008/0265921 A1    Oct. 30, 2008

(30) Foreign Application Priority Data

Apr. 27, 2007   (JP) ............................. 2007-118391

(51) Int. Cl.
*G01R 31/02* (2006.01)
(52) U.S. Cl. ..................... 324/754; 324/762
(58) Field of Classification Search ........................ None
See application file for complete search history.

(56) References Cited

U.S. PATENT DOCUMENTS 5,128,612 A * 7/1992 Aton et al. .................. 324/754
5,177,438 A * 1/1993 Littlebury et al. ........... 324/754
5,576,630 A * 11/1996 Fujita ......................... 324/760
6,268,015 B1 * 7/2001 Mathieu et al. ............. 430/313
6,351,133 B1 * 2/2002 Jones et al. ................. 324/754

FOREIGN PATENT DOCUMENTS

JP    06-140481    5/1994
JP    2006-269148    10/2006

* cited by examiner

*Primary Examiner*—Vinh P Nguyen
(74) *Attorney, Agent, or Firm*—Brinks Hofer Gilson & Lione

(57) ABSTRACT

A probe card includes a base wiring layer, a rewiring layer, and a contactor. The base wiring layer has a non-contactor area and a contactor area that projects to a higher level than the non-contactor area. The rewiring layer is formed on a surface of the base wiring layer so that the contactor area is higher than the non-contactor area. The contactor is provided on a surface of the rewiring layer in a contactor area thereof.

10 Claims, 5 Drawing Sheets

PROBE CARD INCLUDING CONTACTORS FORMED PROJECTION PORTION

CLAIM OF PRIORITY

This application claims benefit of the Japanese Patent Application No. 2007-118391 filed on Apr. 27, 2007, which is hereby incorporated in its entirety by reference.

BACKGROUND OF THE INVENTION

1. Field of the Invention

The present invention relates to a probe card, in particular, to a probe card having a helical contactor.

2. Description of the Related Art

Generally, in order to detect a defect in semiconductor components such as integrated circuits (ICs) and large scale integrated circuits (LSIs), probe cards are commonly used.

When a semiconductor component formed on a wafer is examined by using a common probe card to examine whether it is defective or not, in order to conduct a continuity test, numerous contactors of the probe card are positioned so that the contactors can contact corresponding electrodes of the semiconductor component formed on the wafer. The contactors are provided on a surface of a base wiring layer (or a rewiring layer if the rewiring layer is disposed on the base wiring layer) of the probe card. The types of contactors provided on a probe card can be broadly divided into two types.

A first-type contactor is a needle-type contactor that is composed of a needle (probe pin) with a spring at the bottom end thereof, and this type has been widely used. The use of this probe pin is advantageous in that the length of movement of the probe pin can be easily increased. However, in consideration of high density arrangement of electrodes introduced by miniaturization of semiconductors, it is difficult to realize a high density arrangement of probe pins with a pitch of 150 μm or less because the density of a probe pin array is limited by the shape and structure of the probe pins. Furthermore, it is difficult to improve performance of a contactor in a high-frequency region because the length of movement of a probe pin is long.

In order to satisfy such a requirement of a high-density array or a high performance of contactors in a high-frequency region of contactors, a second-type contactor 104 provided on a known probe card 101 shown in FIG. 7 has been used. The second-type contactor 104, which is provided on a surface 103a of a rewiring layer 103 laminated on a base wiring layer 102 constituting the probe card 101, is made of a thin-film wire formed in a helical shape so as to function as a spring.

However, since it is difficult to form the second-type helical contactor 104 having a large height, the second-type contactor 104 cannot have a greater range of movement than that of the first-type contactor formed in a needle shape. Therefore, if a semiconductor wafer (hereinafter simply referred to as wafer) 110 contacts the probe card 101 at an angle, as shown in FIG. 8, the semiconductor component fails to contact only the contactor 104 and faultily contacts a non-contactor area CB, which is an area having no contactors, of the base wiring layer 102 or the rewiring layer 103. Accordingly the wafer 110 including the semiconductor component becomes damaged.

Furthermore, as shown in FIG. 9, since the second-type contactor 104 has a diameter of about 100 μm and a height of about 50 μm, if the flatness of a contactor area CA, which is an area having contactors, of the base wiring layer 102 or the rewiring layer 103 is as large as about 25 μm to 30 μm, each second-type contactor 104 becomes significantly tilted according to the flatness of contactor area CA around each contactor. Therefore, when a wafer 110 is placed so that electrodes thereon contact all the second-type contactors 104 provided at an angle, the wafer 110 may also contact the area CB of the base wiring layer 102 or the rewiring layer 103, and in such a case, the wafer 110 becomes damaged as mentioned above.

In consideration of the above, the present invention provides a probe card which can prevent damages caused by contact of a wafer and the area where the contactors are not formed.

SUMMARY

A first aspect of the present disclosure provides a probe card including a base wiring layer having a structure in which a contactor area is formed higher than a non-contactor area, a rewiring layer having a structure in which the contactor area is formed on a surface of the base wiring layer so as to be higher than the non-contactor area, and a contactor formed on a surface of the contactor area on the rewiring layer.

According to the probe card of the first aspect of the present invention, since the contactor area is formed higher than the non-contactor area, if a wafer contacts the base wiring layer at an angle, the wafer may be prevented from contacting the non-contactor area.

A probe card of a another aspect of the present disclosure includes the base wiring layer having a contactor area and a non-contactor area on the surface thereon, the rewiring layer disposed on a surface of the base wiring layer, the resin wiring layer formed at a surface of the contactor area alone of the rewiring layer so as to be higher than the non-contactor area of the rewiring layer, and a contactor formed on a surface of the resin wiring layer.

According to the probe card of this other aspect of the present invention, since the contactor area is formed at a higher level than the non-contactor area, if a wafer contacts the base wiring layer at an angle, the wafer may be prevented from contacting the non-contactor area.

DESCRIPTION OF THE EMBODIMENTS

Two embodiments of the probe card of the present invention are described with reference to drawings as follows.

Figure 1:
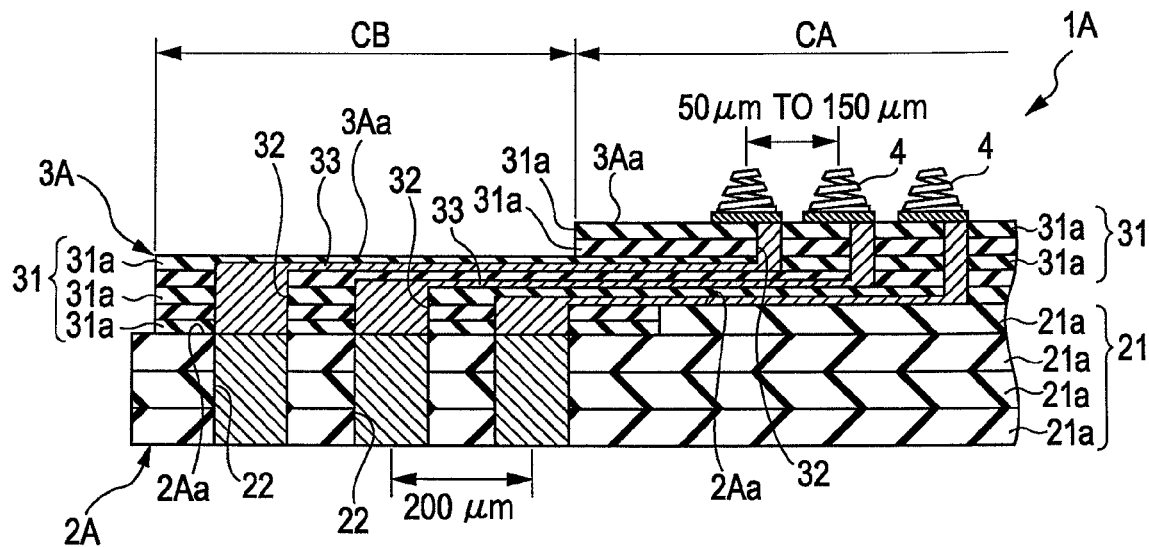
FIG. 1 is a partial longitudinal cross-sectional view showing a probe card of a first embodiment.

First, a probe card 1A of a first embodiment is described with reference to FIG. 1. FIG. 1 is a longitudinal cross-sectional view of the probe card 1A of the first embodiment. As shown in FIG. 1, the probe card 1A includes a base wiring layer 2A, a rewiring layer 3A, and a contactor 4.

The base wiring layer 2A includes a wiring board 21, via holes 22, and an inner layer electrode which is not shown in FIG. 1. The wiring board 21 of the first embodiment is formed by laminating insulator boards 21a made of an insulating material such as a resin or a ceramic. This wiring board 21 may be a single layer board made of one of the insulator boards 21a. A ceramic multilayer board having laminated ceramic boards made of a low-temperature co-fired ceramic (LTCC) board or a high-temperature co-fired ceramic (HTCC) board is used as the wiring board 21 in the first embodiment.

Furthermore, the wiring board 21 of the first embodiment has a structure in which a contactor area CA that projects higher than a non-contactor area CB. This structure is formed by increasing the number of the insulator boards 21a laminated on the contactor area CA so that the height of the contactor area CA becomes higher than the non-contactor area CB. In the case that the base wiring layer 2A is press-formed by isostatic pressing such as warm isostatic pressing (WIP), the contactor area CA may be formed higher than the non-contactor area CB by decreasing the pressure applied to the insulator boards 21a laminated in the contactor area CA as compared with the pressure applied to the insulator boards 21a laminated in the non-contactor area CB.

The rewiring layer 3A is composed of a rewiring board 31, via holes 32, and an inner layer electrode 33. The rewiring layer 3A is formed so as to have a structure in which the contactor area CA of the probe card 1A is higher than the non-contactor area CB. The rewiring layer 3A is formed on a surface 2Aa of the base wiring layer 2A having a projecting portion in the contactor area CA. The rewiring board 31 is formed by laminating the insulator boards 31a made of an insulating material such as a resin or a ceramic. The thickness of the rewiring board 31 is about 10 µm to 20 µm. This rewiring board 31 may be a single layer made of one of the insulator boards 31a.

In the first embodiment, the rewiring board 31 is formed by laminating a plurality of resin boards made of a photosensitive resin such as a polyimide. The resin boards are formed in a desired shape and serve as the insulator boards 31a. As a method for forming the rewiring board 31, common methods for forming a resin layer can be used. Examples of the methods include attaching a resin sheet and coating with a liquid resin so as to have a uniform thickness, for example, spin-coating, dip-coating, roll-coating, and spray-coating. In the first embodiment, the rewiring board 31 is formed by spin-coating the surface 2Aa of the base wiring layer 2A with a liquid resin uniformly formed by using centrifugal force, curing the resulting resin layer, and laminating the desired number of the resulting resin layers. Therefore, the rewiring board 31 has a higher flatness than the base wiring layer 2A made of a ceramic.

The pitch of the via holes 32 of the rewiring layer 3A is smaller than that of the via holes 22 of the base wiring layer 2A. In the first embodiment, the pitch of the via holes 22 of the base wiring layer 2A is about 200 µm and the pitch of the via holes 32 of the base wiring layer 3A is about 50 µm to 150 µm.

The contactor 4 is made of a thin-film wire formed in a helical shape. Similar to a conventional method, the contactor 4 is formed by patterning a helical groove on the surface of a resist formed in a conical shape, forming a metal thin film in the helical groove by plating, and then removing the conical-shaped resist. The diameter of the contactor 4 is about 100 µm and the height thereof is about 50 µm. The contactor 4 is provided on a surface 3Aa of the contactor area CA of the rewiring layer 3A. Although, three contactors 4 are illustrated in FIG. 1, practically, about 5,000 to 10,000 contactors 4 are provided with a pitch of 50 µm to 150 µm.

Figure 2:
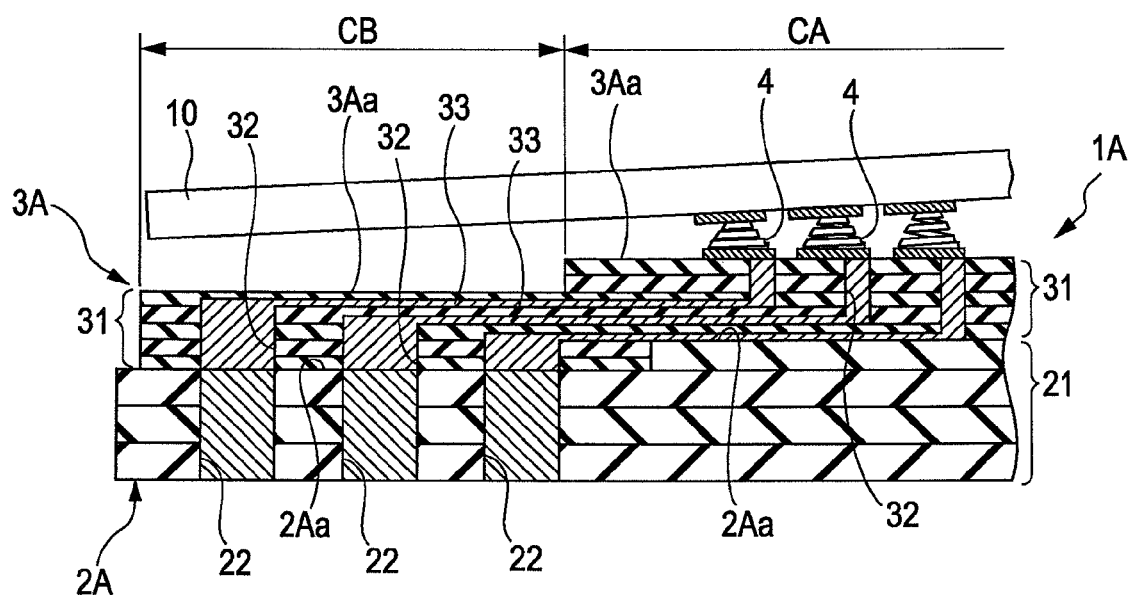
FIG. 2 is a partial longitudinal cross-sectional view showing a state in which a wafer is pressed on the probe card of the first embodiment.

Next, a function of the probe card 1A of the first embodiment will be described with reference to FIG. 2. FIG. 2 is a longitudinal cross-sectional view showing a state in which a wafer 10 contacts, at an angle, the base wiring layer 2A of the probe card 1A of the first embodiment.

Figure 8:
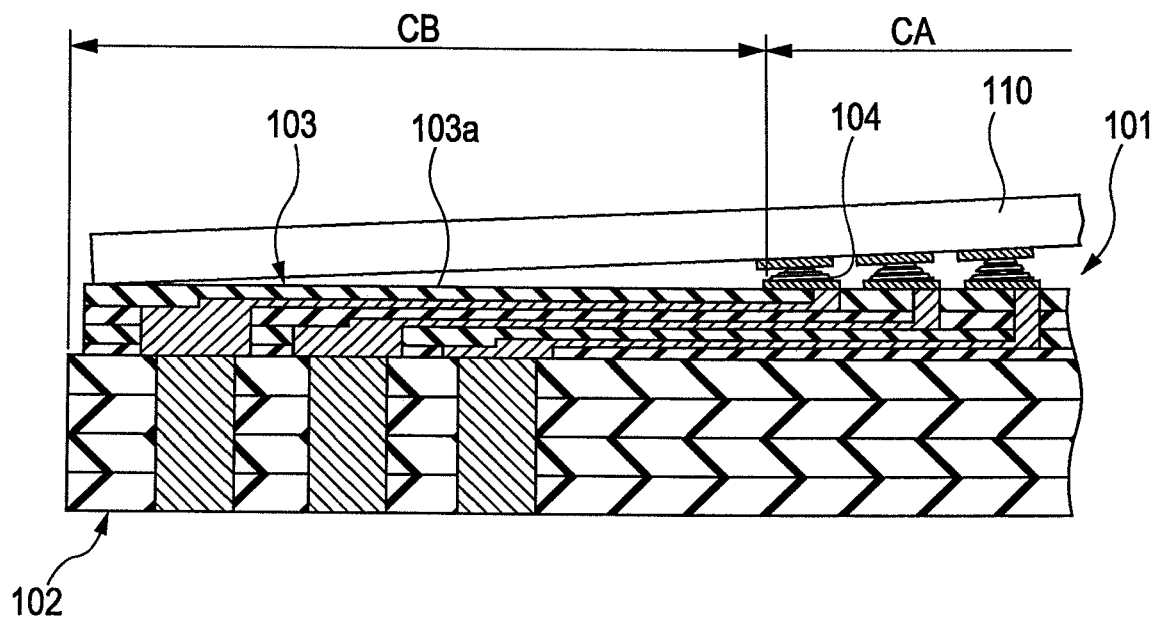
FIG. 8 is a partial longitudinal cross-sectional view showing a state in which a wafer is pressed on a conventional probe card.

In the probe card 1A of the first embodiment, as shown in FIG. 2, a plurality of the contactors 4 are formed in the contactor area CA. Conventionally, a tilted wafer 10 may undesirably contact the non-contactor area CB of the probe card 1A and damages the wafer 10 (see FIG. 8). The probe card 1A of the first embodiment has a base wiring layer 2A having the non-contactor area CB and the contactor area CA, which is formed at higher level than the non-contactor area CB. If the contactor area CA projects to a higher level than the non-contactor area CB, since the contactor 4 is positioned at a higher level than the surface 3Aa of the non-contactor area CB, the distance between the top of the contactor 4 and a surface of the non-contactor area CB can be widened by the height of the contactor area CA. Therefore, a clearance between the wafer 10 and the rewiring board 31 can be widened even though the length of movement of the contactor 4 cannot be increased. This structure can prevent damage being caused by contact of the wafer 10 and the non-contactor area CB of the probe card 1A.

It is preferable that the wiring board 21 is made of a ceramic. If a ceramic, which does not significantly warp when heated in a high temperature continuity test, is used in the wiring board 21, the wiring board 21 does not significantly warp and warping toward the non-contactor area of the wiring board 21 can be prevented. Otherwise a warping of the non-contactor area of the wiring board 21, which is made of a material that warps considerably under high temperature, causes contact of the wiring board 21 and the wafer 10.

Figure 9:
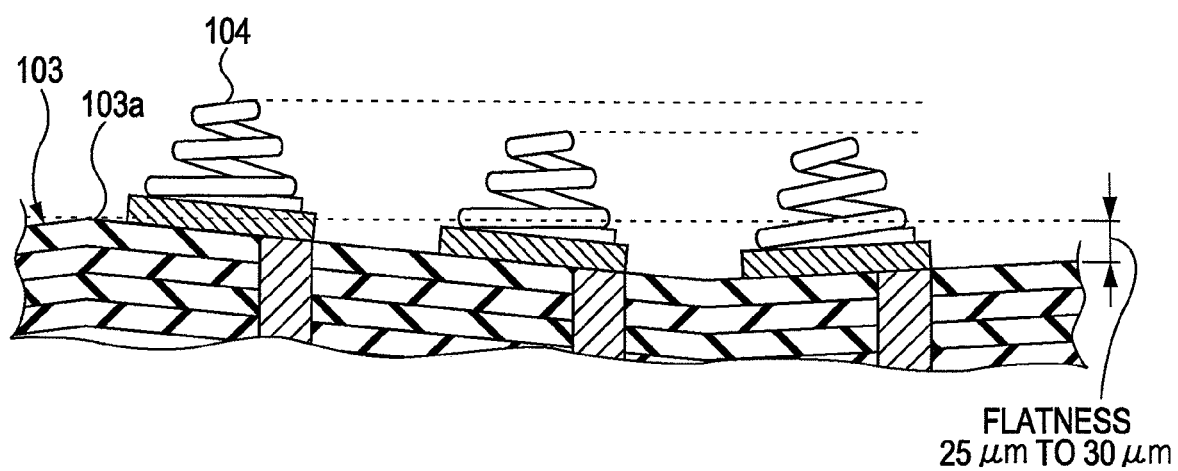
FIG. 9 is a longitudinal cross-sectional view showing a state in which contactors are placed on a conventional probe card at an angle.

In the probe card 1A of the first embodiment, as shown in FIG. 2, the rewiring layer 3A is formed on the surface 2Aa of the base wiring layer 2A having a projecting portion in the contactor area CA thereof. Since the rewiring board 31 serving as a rewiring layer 3A is made of a resin, even if the wafer 10 contacts the non-contactor area CB, the rewiring layer 3A functions as a cushioning material and prevents damage of the wafer 10 from being caused. Furthermore, although the flatness of the wiring board 21 made of ceramic is as high as about 25 µm to 30 µm, the flatness of the rewiring board 31 made of a resin can be reduced to about 10 µm or lower. That is, the surface of the rewiring layer 3A can be formed smoother than the base wiring layer 2A of the contactor area CA. Therefore, the contactor 4 can be provided without being significantly tilted. If each contactor 4 is provided on the same face without being tilted so as to extend in the same direction as other contactors 4, the contactor 4 can achieve better contact than the tilted contactors (see FIG. 9) due to the great range of movement, so that all contactors 4 can securely contact all corresponding electrodes of the wafer. Therefore, contact of the wafer 10 and the rewiring layer 3A, which has been caused by excessively pushing the electrode of the wafer 10 onto the contactor 4 of the probe card 1A, can be prevented.

That is, according to the probe card 1A of the first embodiment, the probe card 1A prevents contact of the wafer 10 and the non-contactor area CB and the rewiring layer 3A serving as a cushion material reduces the impact of the contact, which can prevent damage from being caused even if the wafer 10 contacts the non-contactor area CB of the probe card 1A. Therefore, the prove card 1A can effectively prevent damage from being caused by contact of the wafer 10 and the non-contactor area CB of the probe card 1A.

Figure 3:
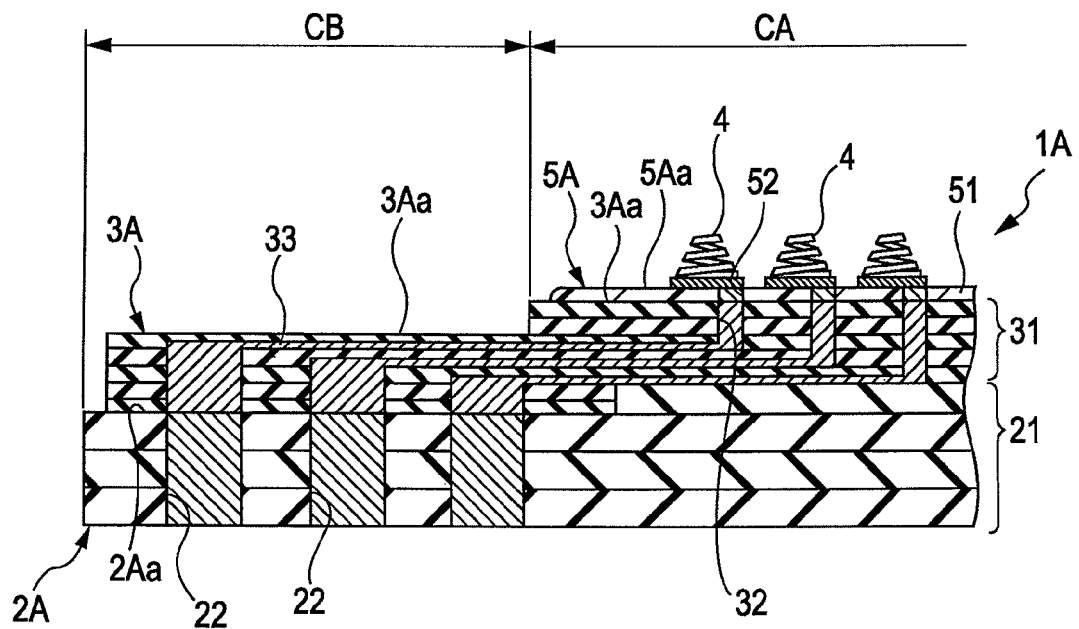
FIG. 3 is a partial longitudinal cross-sectional view showing a structure in which a resin wiring layer is formed on a rewiring layer of the probe card of the first embodiment.

Note that, when it is difficult to improve the flatness of the rewiring layer 3A, it is preferable that, as shown in FIG. 3, a resin wiring layer 5A is disposed between the contactor 4 and the rewiring layer 3A, i.e., on the surface 3Aa of the contactor area CA of the rewiring layer 3A. This resin wiring layer 5A has a resin board 51 and via holes 52. The resin board 51 is formed by uniformly applying a liquid resin by centrifugal force on the surface 3Aa of the rewiring layer 3A, and then curing the applied liquid resin. In the case that the resin board 51 is formed by coating with a liquid resin, the surface 5Aa of the resin wiring layer 5A becomes smooth because of the weight of the liquid resin. Therefore, the flatness of the contactor area CA can be improved to 10 μm or lower by forming the resin wiring layer 5A on the contactor area CA. That is, the flatness of the contactor area CA of the rewiring layer 3A formed by coating can be improved compared with the flatness of a conductor area CA formed by other methods.

Figure 4:
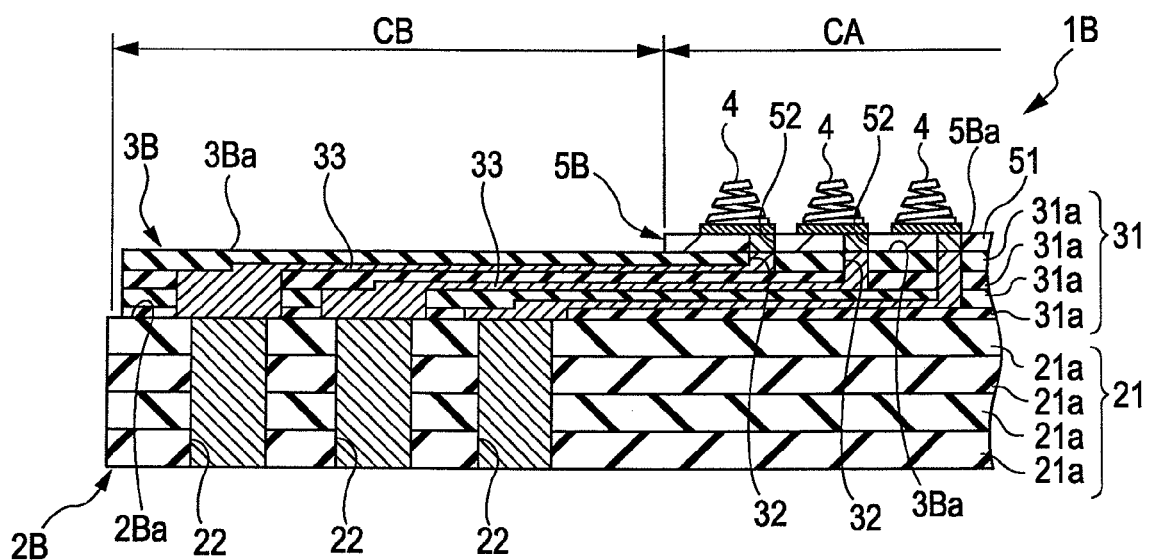
FIG. 4 is a partial longitudinal cross-sectional view showing a probe card of a second embodiment.
Figure 5:
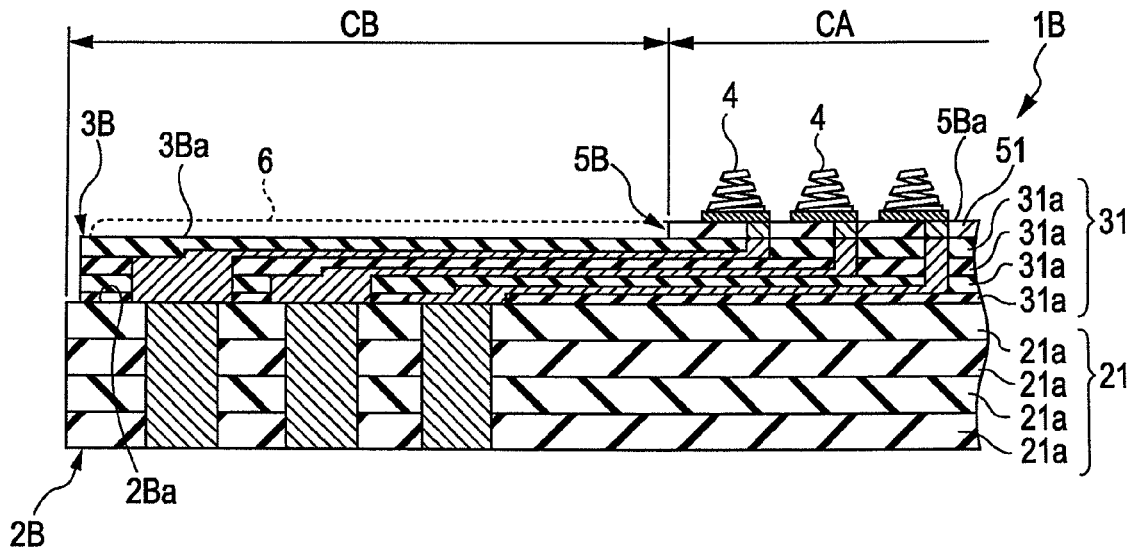
FIG. 5 is a partial longitudinal cross-sectional view showing an unnecessary part of the resin wiring layer of the second embodiment.

Next, a probe card 1B of the second embodiment is described with reference to FIGS. 4 and 5. FIG. 4 is a longitudinal cross-sectional view of the probe card 1B of the second embodiment. The probe card 1B of the second embodiment includes the base wiring layer 2B, the rewiring layer 3B, the resin wiring layer 5B, and a contactor 4. The difference between the probe card 1A of the first embodiment and the probe card 1B of the second embodiment is that the contactor area CA of the base wiring layer 2B does not project towards upward.

The base wiring layer 2B of the second embodiment includes a wiring board 21, via holes 22, and an inner layer electrode which is not shown in the drawings. Similar to the first embodiment, the wiring board 21 is formed by laminating insulator boards 21a. As long as the wiring board 21 has the contactor area CA and the non-contactor area CB on a surface 2Ba thereof, the number of the insulator boards 21a is not limited. In consideration on the above, the contactor area CA and the non-contactor area CB of the wiring board 21 of the second embodiment are formed to be on the same level and have a same thickness. The wiring board 21 constituting the base wiring layer 2B is made of a ceramic as similar to the first embodiment.

The rewiring layer 3B includes a rewiring board 31, via holes 32, and inner layer electrodes 33, and is formed on a surface 2Ba of the base wiring layer 2B. The rewiring board 31 is composed of laminated flat resin boards serving as insulator boards 31a and has a uniform thickness. The base wiring layer 2B has a conductor area CA and a non-contactor area CB disposed on the same level, therefore, the rewiring layer 3B also has a conductor area CA and a non-contactor area CB on a same level and has a uniform thickness.

The resin wiring layer 5B includes a resin board 51, via holes 52, and electrodes and is formed only on a surface 3Ba of the contactor area CA of the rewiring layer 3B. In the probe card 1B of the second embodiment, since each of the base wiring layer 2B and the rewiring layer 3B is formed to have a uniform thickness, the conductor area CA is higher than the non-contactor area CB due to the thickness of the resin wiring layer 5B. The thickness of the resin wiring layer 5B is determined to be a difference in height between the conductor area CA and the non-contactor area CB. The difference in height is equivalent to the thickness of the resin. The thickness of the resin wiring layer 5B of the second embodiment is about 10 μm to 20 μm. If the thicknesses of the base wiring layer 2B and the rewiring layer 3B are not uniform, the thickness of the resin wiring layer 5B is determined to satisfy the desired total height, which includes the difference of height between the conductor area CA and the non-contactor area CB of the base wiring layer 2B and the rewiring layer 3B and the thickness of the resin wiring layer 5B.

The resin board 51 constituting a resin wiring layer 5B has a smooth surface 5Ba, which is formed by applying a liquid resin on a surface 3Ba of the rewiring layer 3B and curing the applied liquid resin. Examples of coating method include spin-coating, dip-coating, roll-coating, and spray-coating. In the second embodiment, spin-coating is used. In order to form the resin board 51 constituting a resin wiring layer 5B in the contactor area alone, as shown in FIG. 5, a liquid resin layer is uniformly formed in the contactor area and the non-contactor area by applying a photoresist resin such as polyimide. Then, by removing an unnecessary part 6 of the resin wiring layer 5B by exposing and developing, a difference of height between the contactor area and the non-contactor area is provided.

A contactor 4 is formed in a helical shape and a plurality of contactors is provided on the surface 5Ba of the resin wiring layer 5B.

Next, a function of the probe card 1B of the second embodiment will be described with reference to FIG. 6.

Figure 6:
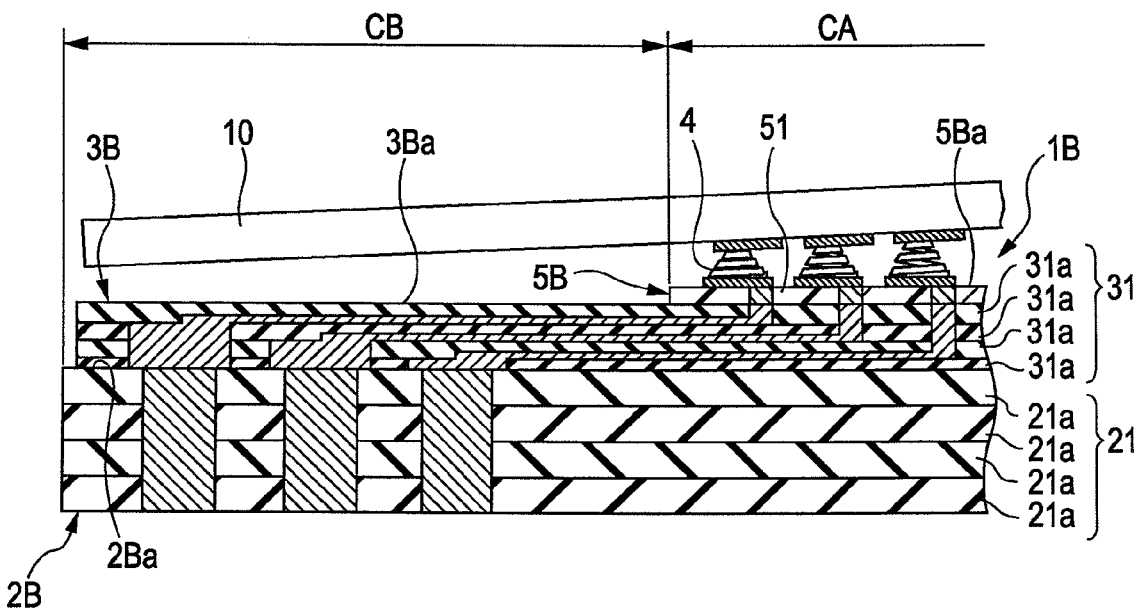
FIG. 6 is a partial longitudinal cross-sectional view showing a state in which a wafer is pressed on the probe card of the second embodiment.
Figure 7:
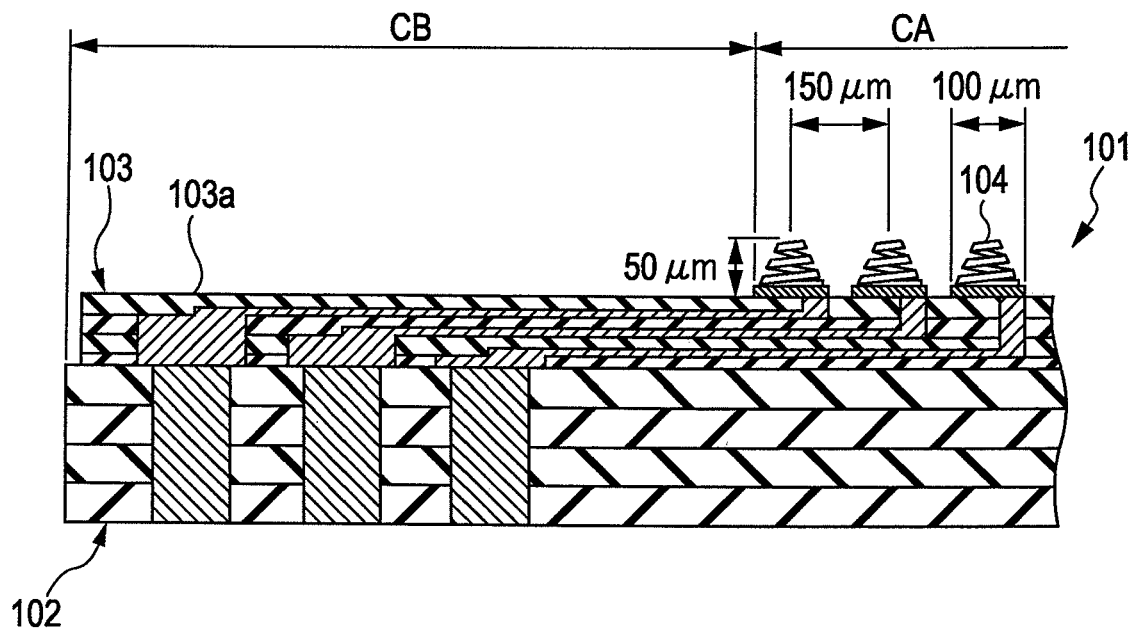
FIG. 7 is a partial longitudinal cross-sectional view showing an example of the conventional probe cards.

As shown in FIG. 6, a probe-card 1B of the third embodiment has a structure in which the rewiring layer 3B having a uniform thickness is formed on the surface 2Ba of the base wiring layer 2B also having a uniform thickness, and the resin wiring layer 5B is formed on the surface 3Ba of the contactor area CA of the rewiring layer 3B. Since the contactor area CA is higher than the non-contactor area CB, the wafer 10 does not contact the rewiring layer 3B formed in the non-contactor area CB even if the wafer 10 contacts the base wiring layer 2B at an angle.

The resin board 51 constituting a resin wiring layer 5B has a smooth surface 5Ba, which is formed by applying a liquid resin on the surface 3Ba of the rewiring layer 3B and curing the applied liquid resin. In a case that the resin board 51 is formed by applying a liquid resin, the flatness of the resin wiring layer 5B can be 10 μm or less. In consideration above, the flatness of the contactor area CA of the resin wiring layer 5B formed by an applying method is better or greater than the flatness thereof formed by a method other than the applying method. Therefore, contactor 104 does not significantly at an angle. If the contactors 4 project from the same surface toward the same direction without being tilted, the length of the contactors 4 can effectively used to prevent damage that is caused by contact of the rewiring layer 3B and the wafer 10 pressing unnecessarily the contactors 4 of the probe card 1B.

If the wafer 10 contacts the rewiring layer 3B, similar to the first embodiment, since the rewiring board 31 constituting the rewiring layer 3B is made of resin, which has high elasticity and flexibility, and functions as a cushion material, the wafer 10 is not damaged. Furthermore, since the rewiring layer 3B can be formed to have a better or greater flatness than that of contactor area CA of the base wiring layer 2B, contactor 4 can be provided without being tilted.

Similar to the first embodiment, it is preferable that the wiring board 21 constituting the base wiring layer 2B and disposed under the rewiring layer 3B, includes a ceramic. Since the ceramic does not significantly warp in a high temperature situation, in which a high temperature continuity test for the semiconductor components performed using the probe card 1B, contact of the wafer 10 and the wiring board 21 warping toward the wafer 10 can be prevented.

That is, according to the probe card 1B of the second embodiment, the probe card 1A prevents contact of the wafer 10 and the non-contactor area CB and the rewiring layer 3B serving as a cushion material reduces the impact of the contact, which can prevent damage from being caused even if the wafer 10 contacts the non-contactor area CB of the probe card 1B. Therefore, the prove card 1A can effectively prevent damage from being caused by contact of the wafer 10 and the non-contactor area CB of the probe card 1A.

Note that the present invention is not limited to the above-mentioned embodiments and various modifications of the present invention in accordance with requirements can be made.

What is claimed is:

1. A probe card comprising:
   a base wiring layer having a contactor area, a noncotnactor area on a surface thereof and via holes and wherein the contactor area projects higher than the non-contactor area;
   a rewiring layer disposed on the surface of the base wiring layer, the rewiring layer having via holes and a contactor area higher than the non-contactor area utilizing the height of the projecting contactor area in the base wiring layer, and pitch of the via holes of the rewiring layer being smaller than pitch of the via holes of the base wiring layer; and
   a contactor disposed on the surface in the contactor area of the rewiring layer, the contactor formed on the surface of the rewiring layer at the contactor area to correspond to the via holes of the rewiring layer that are formed with the pitch that is smaller than the pitch of the via holes of the base wiring layer.

2. The probe card according to claim 1, further comprising:
   a resin wiring layer disposed on the surface of the contactor area of the rewiring layer and disposed between the rewiring layer and the contactor.

3. The probe card according to claim 1, wherein a rewiring board constituting the rewiring layer comprises a resin having a flatness greater than the flatness of the base wiring layer.

4. The probe card according to claim 1, wherein a wiring board constituting the base wiring layer comprises a ceramic.

5. A probe card comprising: a base wiring layer having a contactor area and a non-contactor area on a surface thereof, wherein the contactor area projects higher than the non-contactor area;
   a rewiring layer disposed on the surface of the base wiring layer, the rewiring layer having a contactor area higher than the non-contactor area utilizing the height of the projecting contactor area in the base wiring layer;
   a contactor disposed on the surface in the contactor area of the rewiring layer; and
   a resin wiring layer disposed on the surface of the contactor area of the rewiring layer and disposed between the rewiring layer and the contactor,
   wherein a resin board constituting the resin wiring layer has a smooth surface formed of a cured liquid resin on the surface of the rewiring layer.

6. The probe card according to claim 5, wherein a rewiring board constituting the rewiring layer comprises a resin having a flatness greater than the flatness of the base wiring layer.

7. The probe card according to claim 5, wherein a wiring board constituting the base wiring layer comprises a ceramic.

8. A probe card comprising
   a base wiring layer having a contactor area and a non-contactor area on a surface thereof;
   a rewiring layer disposed on the surface of the base wiring layer:
   a resin wiring layer disposed only on the surface of the contactor area of the rewiring layer, wherein the contactor area of the resin wiring layer is higher than the non-contactor area of the rewiring layer; and
   a plurality of electrically independent contactor disposed on a surface of the resin wiring layer,
   wherein a resin board constituting the resin wiring layer has a smooth surface formed of a cured liquid resin on the surface of the rewiring layer.

9. The probe card according to claim 8, wherein a rewiring board constituting the rewiring layer comprises a resin having a flatness greater than the flatness of the base wiring layer.

10. The probe card according to claim 8, wherein a wiring board constituting the base wiring layer comprises a ceramic.

* * * * *

UNITED STATES PATENT AND TRADEMARK OFFICE
CERTIFICATE OF CORRECTION

PATENT NO. : 7,679,386 B2  Page 1 of 1
APPLICATION NO. : 12/102313
DATED : March 16, 2010
INVENTOR(S) : Shinji Murata It is certified that error appears in the above-identified patent and that said Letters Patent is hereby corrected as shown below:

In column 7, claim 1, line 22, after "a contactor area, a" replace "noncotnactor" with --non-contactor--.

In column 8, claim 5, line 3, after "probe card comprising:" start a new paragraph with the words "a base wiring layer".

Signed and Sealed this

Thirty-first Day of August, 2010

David J. Kappos
*Director of the United States Patent and Trademark Office*